United States Patent
Lee et al.

(10) Patent No.: US 9,105,493 B2
(45) Date of Patent: Aug. 11, 2015

(54) HIGH VOLTAGE METAL-OXIDE-SEMICONDUCTOR TRANSISTOR DEVICE AND LAYOUT PATTERN THEREOF

(75) Inventors: Ming-Tsung Lee, Yilan County (TW); Cheng-Hua Yang, Hsinchu (TW); Wen-Fang Lee, Hsinchu (TW); Chih-Chung Wang, Hsinchu (TW); Te-Yuan Wu, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 379 days.

(21) Appl. No.: 13/476,019

(22) Filed: May 21, 2012

(65) Prior Publication Data
US 2013/0307071 A1 Nov. 21, 2013

(51) Int. Cl.
*H01L 29/78* (2006.01)
*H01L 29/08* (2006.01)
*H01L 29/06* (2006.01)
*H01L 29/40* (2006.01)
*H01L 29/423* (2006.01)

(52) U.S. Cl.
CPC ........ *H01L 29/0878* (2013.01); *H01L 29/0634* (2013.01); *H01L 29/0696* (2013.01); *H01L 29/7816* (2013.01); *H01L 29/404* (2013.01); *H01L 29/42368* (2013.01)

(58) Field of Classification Search
CPC ....................................................... H01L 29/78
USPC .......................................... 257/343, E29.256
See application file for complete search history.

(56) References Cited

U.S. PATENT DOCUMENTS

| | | | | |
|---|---|---|---|---|
| 6,873,011 | B1 * | 3/2005 | Huang et al. | 257/345 |
| 8,692,326 | B2 * | 4/2014 | Lee et al. | 257/343 |
| 2002/0185696 | A1 * | 12/2002 | Beasom | 257/409 |
| 2009/0039425 | A1 * | 2/2009 | Shu et al. | 257/339 |
| 2010/0327330 | A1 * | 12/2010 | Eklund | 257/262 |
| 2013/0214355 | A1 * | 8/2013 | Fang et al. | 257/343 |

FOREIGN PATENT DOCUMENTS

CN 101969074 A * 2/2011

OTHER PUBLICATIONS

Lee et al., Title: High Voltage Metal-Oxide-Semiconductor Transistor Device and Layout Pattern Thereof, pending U.S. Appl. No. 13/407,722, filed Feb. 28, 2012.

* cited by examiner

*Primary Examiner* — Asok K Sarkar
*Assistant Examiner* — Dmitry Yemelyanov
(74) *Attorney, Agent, or Firm* — Winston Hsu; Scott Margo

(57) ABSTRACT

A layout pattern of a high voltage metal-oxide-semiconductor transistor device includes a first doped region having a first conductivity type, a second doped region having the first conductivity type, and an non-continuous doped region formed in between the first doped region and the second doped region. The non-continuous doped region further includes a plurality of third doped regions, a plurality of gaps, and a plurality of fourth doped regions. The gaps and the third doped regions s are alternately arranged, and the fourth doped regions are formed in the gaps. The third doped regions include a second conductivity type complementary to the first conductivity type, and the fourth doped regions include the first conductivity type.

18 Claims, 6 Drawing Sheets

HIGH VOLTAGE METAL-OXIDE-SEMICONDUCTOR TRANSISTOR DEVICE AND LAYOUT PATTERN THEREOF

BACKGROUND OF THE INVENTION

1. Field of the Invention

The invention relates to a high voltage metal-oxide-semiconductor (herein after abbreviated as HV MOS) device and a layout pattern thereof, and more particularly, to a high voltage lateral double-diffused metal-oxide-semiconductor (HV-LDMOS) device and a layout pattern thereof.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operational voltage environment such as CPU power supply, power management system, AC/DC converter, and high-power or high frequency (HF) band power amplifier. The essential feature of LDMOS transistor device is a lateral-diffused drift region with low dope concentration and large area. The drift region is used to alleviate the high voltage between the drain and the source, therefore the LDMOS transistor device can have higher breakdown voltage.

Please refer to FIG. 1, which is a cross-sectional view of a conventional HV-LDMOS transistor device. As shown in FIG. 1, the conventional HV-LDMOS transistor device 10 having a P-type well 20, a source 14 and a P-type heavily doped region 22 formed in the P-type well 20, a gate 16 and a drain 18 is formed on a semiconductor substrate 12. The drain 18 is an N-type heavily doped region formed in an N-type well 30, which is the drift region as mentioned above. The dope concentration and length of the drift region affects the breakdown voltage and the ON-resistance ($R_{ON}$) of the HV-LDMOS transistor device 10. The gate 16 of the HV-LDMOS transistor device 10 is positioned on a gate dielectric layer 40 and extended to cover a portion of a field oxide layer 42.

It is well-known that characteristics of low $R_{ON}$ and high breakdown voltage are always required to the HV MOS transistor device. However, breakdown voltage and $R_{ON}$ are conflicting parameters with a trade-off relationship. Therefore, a HV LDMOS transistor device that is able to realize high breakdown voltage and low $R_{ON}$ is still in need.

SUMMARY OF THE INVENTION

According to the claimed invention, a layout pattern of a HV MOS transistor device is provided. The layout pattern includes a first doped region having a first conductivity type, a second doped region having the first conductivity type, and an non-continuous doped region formed in between the first doped region and the second doped region. The non-continuous doped region further includes a plurality of third doped regions, a plurality of gaps, and a plurality of fourth doped regions formed in the gaps. The gaps and the third doped regions are alternately arranged. The third doped regions include a second conductivity type being complementary to the first conductivity type, and the fourth doped regions comprising the first conductivity type.

According to the claimed invention, a HV MOS transistor device is provided. The HV MOS transistor includes a substrate having an insulating layer formed thereon, a gate positioned on the substrate and covering a portion of the insulating layer, a drain region positioned in the substrate, a source region positioned in the substrate, and a non-continuous doped region positioned in between the drain region and the source region. The non-continuous doped region further includes a plurality of third doped regions, a plurality of gaps, and a plurality of fourth doped regions formed in the gaps. The drain region, the source region, and the fourth doped regions include a first conductivity type, and the third doped regions include a second conductivity type complementary to the first conductivity type. The gaps and the third doped regions are alternately arranged.

According to the HV MOS transistor device and its layout pattern provided by the present invention, the non-continuous doped region is rendered to improve the breakdown voltage of the HV MOS transistor device. Furthermore, since the non-continuous doped region is interrupted by the gaps, the total area of doped portions of the non-continuous doped region is reduced. More important, the fourth doped regions formed in the gaps serve as an easy pathway for the passing electrons. Consequently, $R_{ON}$ is decreased efficaciously. Briefly speaking, the HV MOS transistor device and the layout pattern thereof provided by the present invention realize the expectation of high breakdown voltage and low $R_{ON}$.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
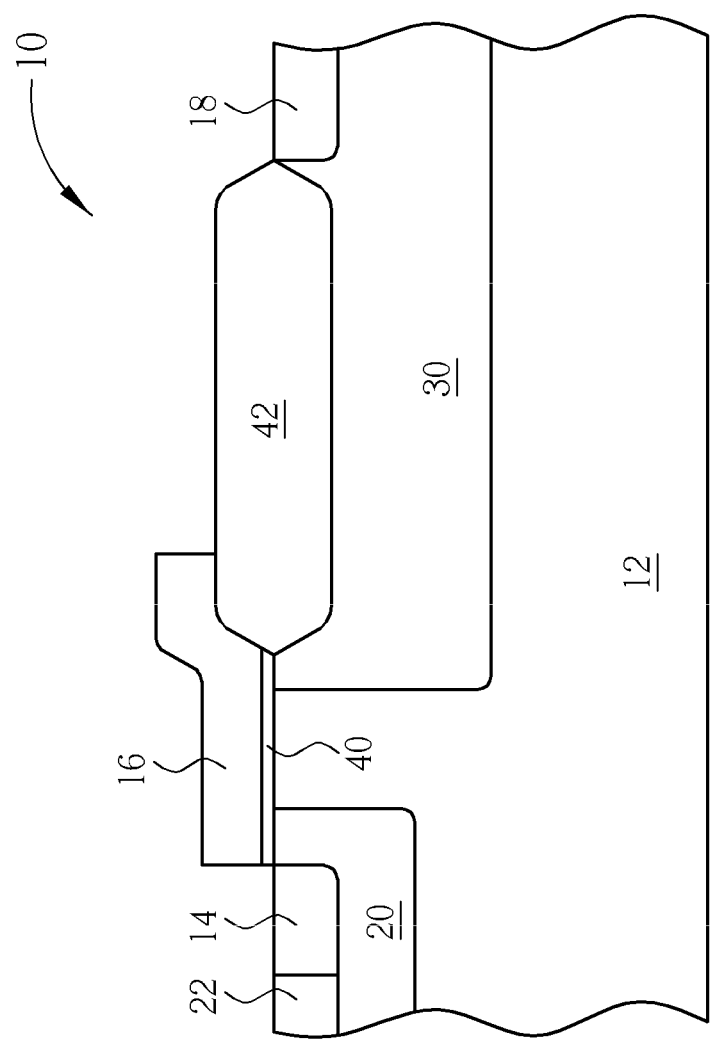
FIG. 1 is a cross-sectional view of a conventional HV-LDMOS transistor device.
Figure 2:
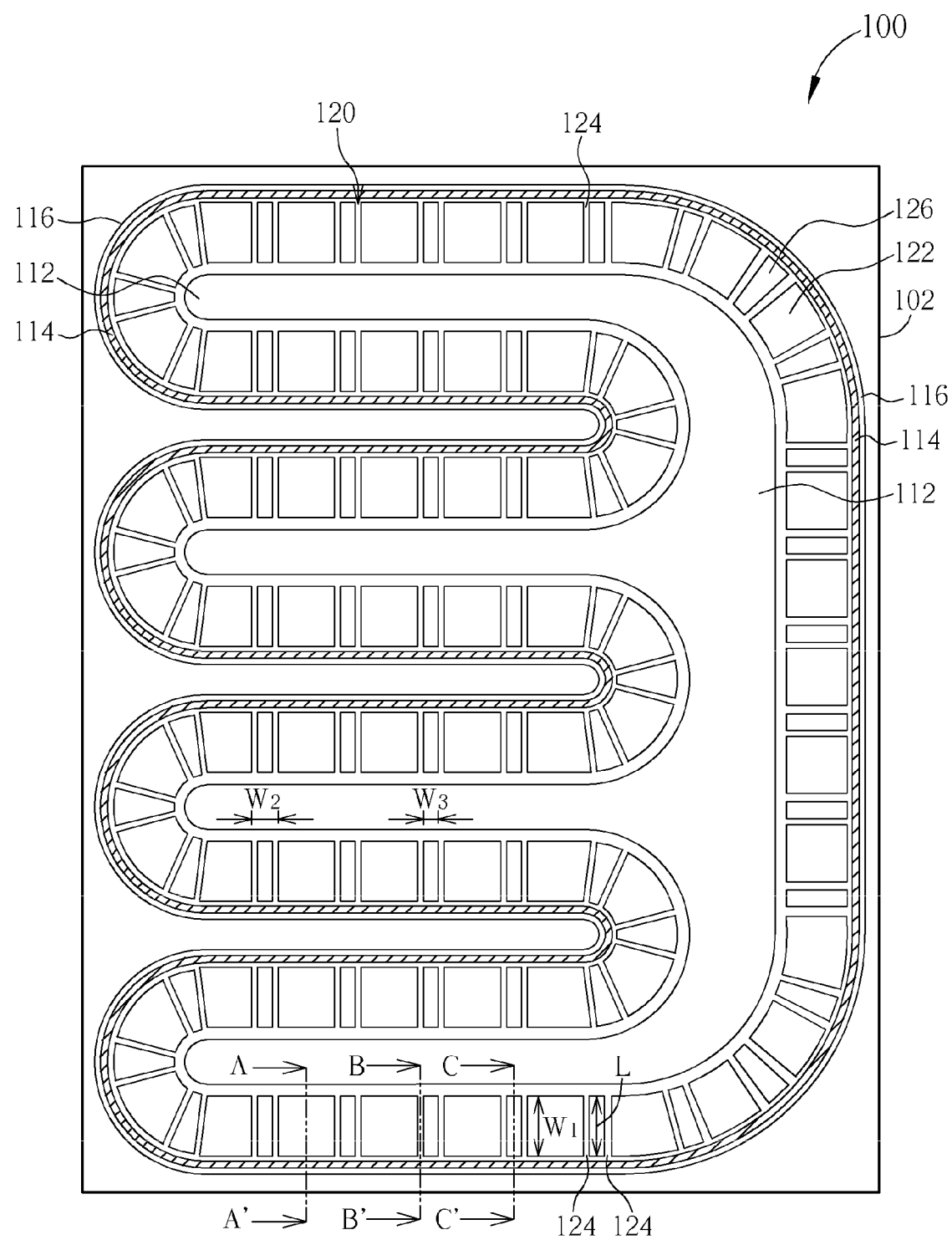
FIGS. 2 and 6-7 is a schematic drawing of a layout pattern of a HV MOS transistor device provided by a preferred embodiment of the present invention.
Figure 3:
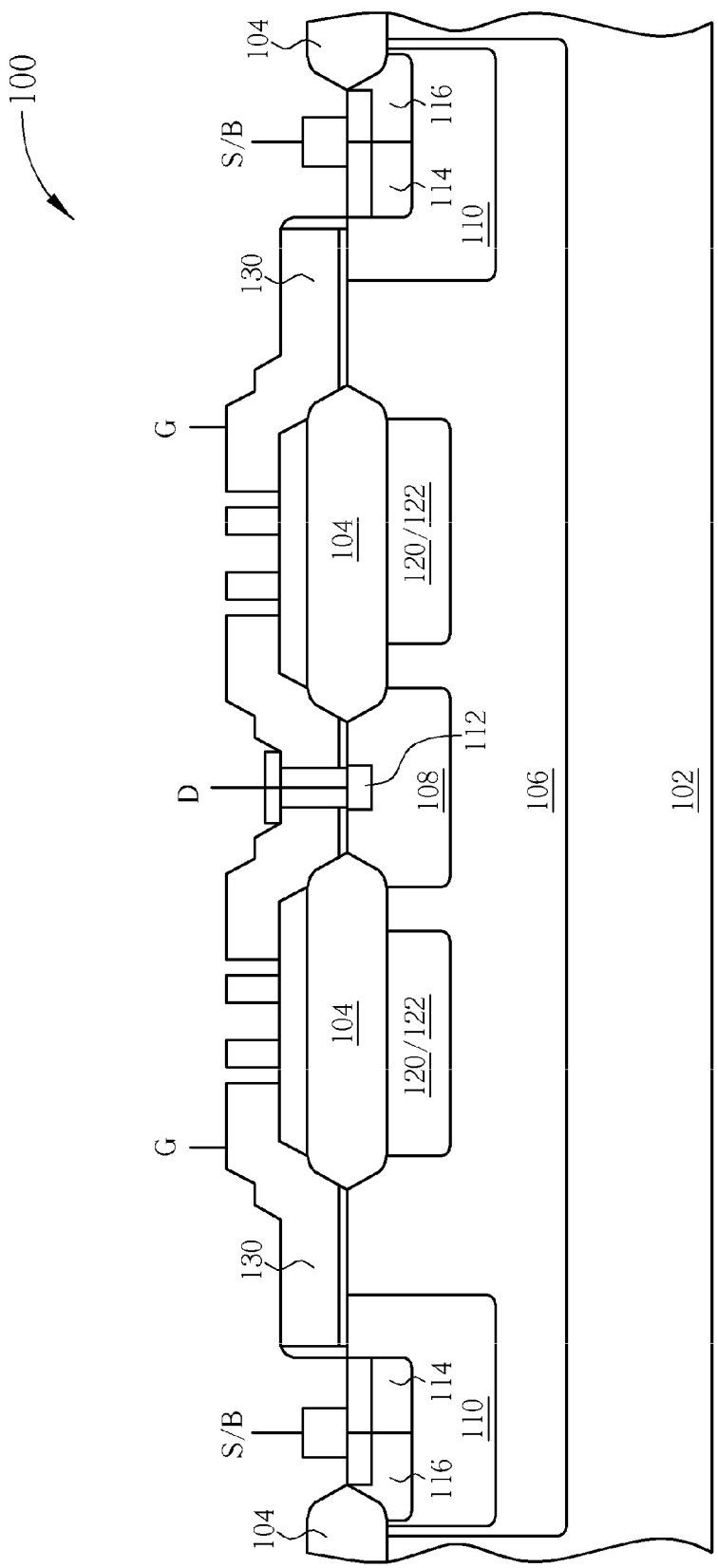
FIGS. 3-5 are cross-sectional views of the HV MOS transistor device take along A-A', B-B', and C-C' of FIG. 2, respectively.
Figure 4:
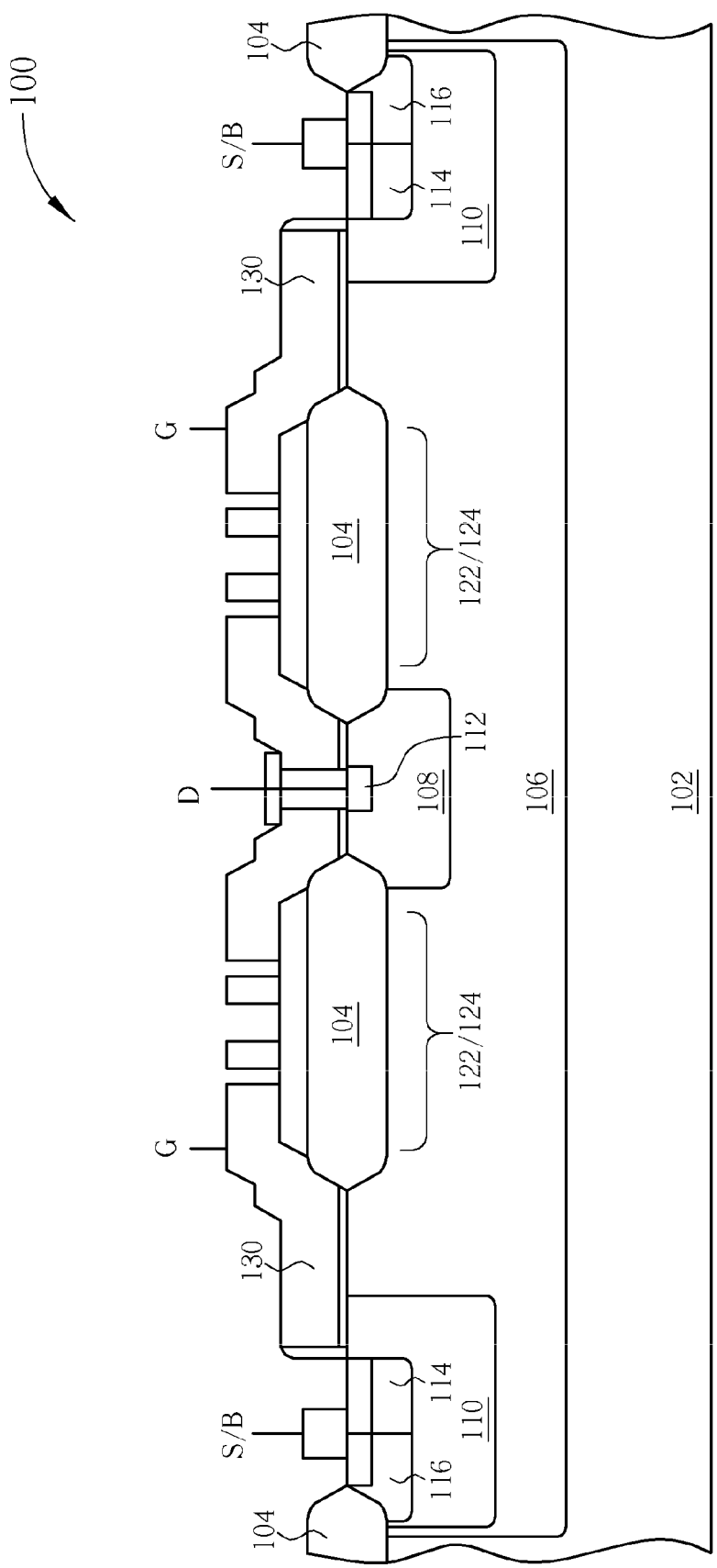
Figure 5:
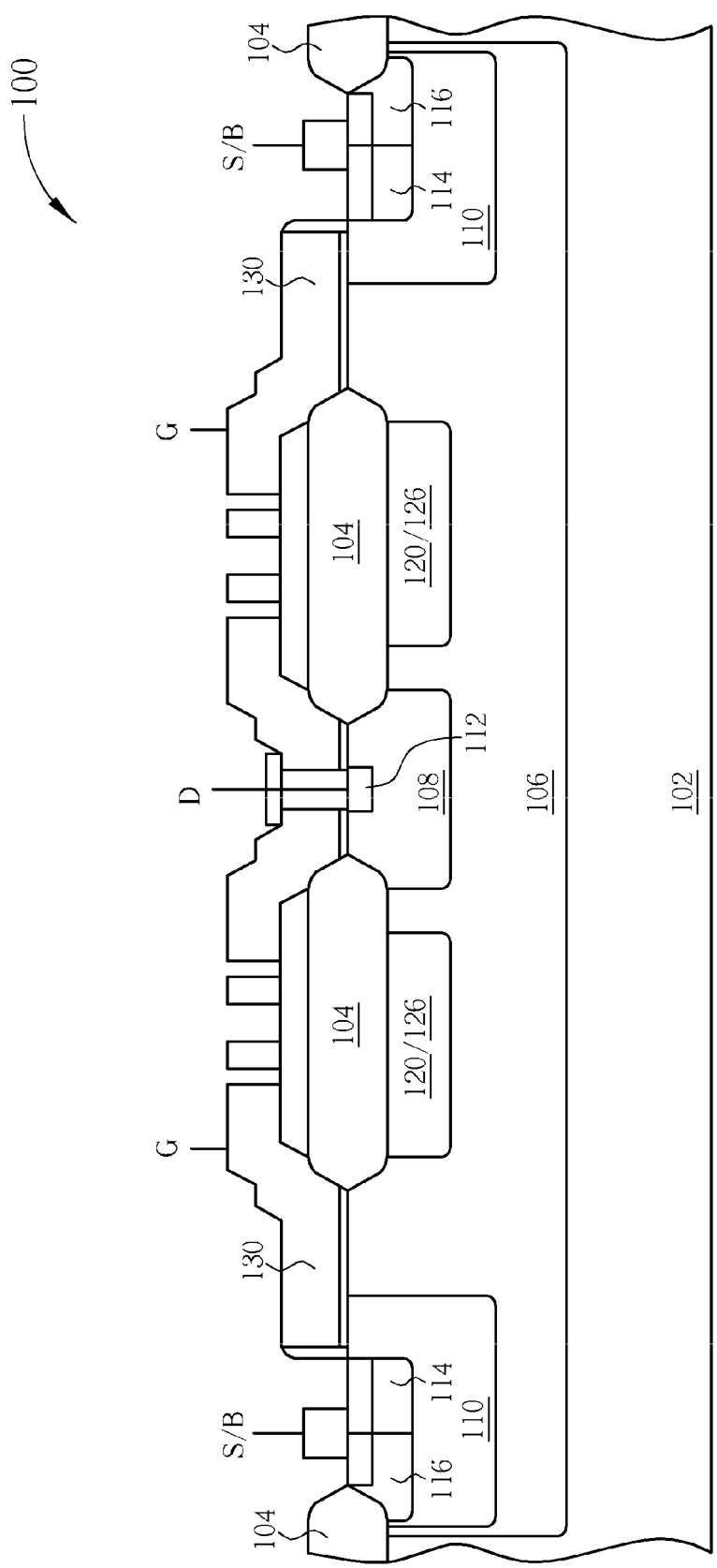

Please refer to FIGS. 2-7, FIG. 2 is a schematic drawing of a layout pattern of a HV MOS transistor device provided by a preferred embodiment of the present invention, and FIGS. 3-5 are cross-sectional views of the HV MOS transistor device take along A-A', B-B,' and C-C' of FIG. 2, respectively. As shown in FIGS. 2-5, a HV MOS transistor device 100 provided by the preferred embodiment is positioned in a substrate 102, such as a silicon substrate. The substrate 102 includes a first conductivity type. In the preferred embodiment, the first conductivity type is p-type. The HV MOS transistor device 100 further includes an insulating layer 104. It is noteworthy that for clarifying spatial relationships between certain specific doped regions of the HV MOS transistor device 100, the insulating layer 104 is omitted from FIG. 2. However, those skilled in the art would easily realize the location where the insulating layer 104 is formed according to FIGS. 3-5.

Please still refer to FIGS. 2-5. The HV MOS transistor device 100 provided by the preferred embodiment further includes a deep well 106 having a second conductivity type. The second conductivity type and the first conductivity type are complementary to each other. Accordingly, the second conductivity type is n-type in the preferred embodiment. A drift region 108 and a high-voltage well region 110 (both shown in FIGS. 3-5) are formed in the deep well 160. The drift region 108 includes the second conductivity type while the high-voltage well region 110 includes the first conductivity type. In other words, the HV MOS transistor device 100 includes an n-type drift region 108 and a p-type high-voltage well region 110. A first doped region 112 is formed in the n-type drift region 108 while a second doped region 114 and a third doped region 116 are formed in the high-voltage well region 110. The first doped region 112 and the second doped region 114 include the second conductivity type and respectively serve as an n-type drain (n-drain) region 112 and an n-type source (n-source) region 114 of the HV MOS transistor device 100. The third doped region 116 includes the first conductivity type and serves as a p-type body (p-body) region 116 of the HV MOS transistor device 100. In addition, the body region 116 and the source region 114 are electrically connected as shown in FIGS. 2-5.

The HV MOS transistor device 100 also includes a gate 130. The gate 130 is omitted from FIG. 2 in order to clarify spatial relationships between certain specific doped regions of the HV MOS transistor device 100. However those skilled in the art would easily realize the location where the gate 130 is formed according to FIGS. 3-5. As shown in FIGS. 3-5, the gate 130 is positioned on the substrate 102 and covers a portion of the insulating layer 104.

Please still refer to FIGS. 2-5. The HV MOS transistor device 100 provided by the preferred embodiment further includes a non-continuous doped region 120. The non-continuous doped region 120 is positioned in between the n-drain region 112 and the n-source region 114. The drain region 112, the source region 114, and the non-continuous doped region 120 formed in the deep well 106 are not only spaced apart from each other, but also electrically isolated from each other by the deep well 106. As shown in FIGS. 2-5, the non-continuous doped region 120 further includes a plurality of fourth doped regions 122, a plurality of gaps 124, and a plurality of fifth doped regions formed therein. The fourth doped regions 122 include the first conductivity type, therefore those fourth doped regions 122 are p-doped regions. The fifth doped regions 126 include the second conductivity type, therefore those fifth doped regions 126 are n-doped regions. More important, the fifth doped regions 126 includes a dope concentration, and the dope concentration is smaller than $1*10^{12}$ (1E12), but not limited to this.

As shown in FIG. 2. The gaps 124 and the p-doped regions 122 are alternately arranged. Therefore each p-doped region 122 is adjacent to a gap 124. And the n-doped regions 126 are formed in the gaps 124. Therefore the p-doped regions 122 and the n-doped regions 126 are spaced apart from each other by the gaps 124. Furthermore, as shown in FIGS. 3-5, the insulating layer 104 covers the entire non-continuous doped region 120. In other words, the insulating layer 104 entirely covers the p-doped regions 122 (shown in FIG. 3), the gaps 124 (shown in FIG. 4), and the n-doped regions 126 (shown in FIG. 5). It is noteworthy that a ratio between a total area of the gaps 124 and a total area of the non-continuous doped region 120 is to be smaller than or equal to 20% according to the preferred embodiment. It is also noteworthy that though each of the gaps 124 includes one n-doped region 126 formed therein, the n-doped region 126 can be selectively omitted from the gaps 124 according to different product requirements. In other words, in some modification to the preferred embodiment, the n-doped regions 126 are formed in some of the gaps 124 yet omitted from some of the gaps 124.

Please refer to FIG. 2 again. According to the HV MOS transistor device 100 and the layout pattern provided by the preferred embodiment, the p-doped regions 122 and the n-doped regions 126 all include rectangular shapes, and a long side of n-doped regions 126 is parallel with a short side of the p-doped regions 122. More important, a length L of the n-doped regions 126 is equal to a width $W_1$ of the p-doped regions 122 as shown in FIG. 2. Furthermore, a width $W_2$ of the gaps 124 is smaller than or equal to 9 micrometer (μm). Accordingly, a width $W_3$ of the n-doped regions 126 formed in the gaps 124 is smaller than 7 μm. More important, the width $W_3$ of the n-doped regions 126 is always smaller than the width $W_2$ of the gaps 124.

According to the preferred embodiment, the p-doped region 122 of the non-continuous doped region 120 being formed under the insulating layer 104 and complementary to the n-source region 114 and the n-drain region 112 increases the resistance of the HV MOS transistor device 100. When high voltage signal (HV signal) passes through the p-doped regions 122, the voltage step-down ability of the HV MOS transistor device 100 is consequently improved and the acceptable lower voltage signal is obtained. In other words, by providing the p-doped regions 122, the breakdown voltage of the HV MOS transistor device 100 is efficaciously increased. However, it is well known that $R_{ON}$ is always undesirably increased in accompaniment of the increased breakdown voltage. Therefore the preferred embodiment provides the gaps 124 interrupting in the non-continuous doped region 120. The gaps 124 are provided to lower the total doped area of the p-doped regions 122 therefore $R_{ON}$ is efficaciously reduced.

More important, the preferred embodiment further provides the n-doped regions 126 serving as an easy pathway for the electrons, thus $R_{ON}$ can be further reduced. As mentioned above, since breakdown voltage and $R_{ON}$ are conflicting parameters with a trade-off relationship, the ratio between a total area of the gaps 124 and the total area of the non-continuous doped region 120 must be smaller than or equal to 20%, the width $W_2$ of the gaps 124 must be smaller than 9 μm, the dope concentration of the n-doped regions 126 must be smaller than 1E10, and the width $W_3$ of the n-doped regions 126 must be smaller than 7 μm. Consequently, $R_{ON}$ can be reduced while the expectation of high breakdown voltage is still met.

Figure 6:
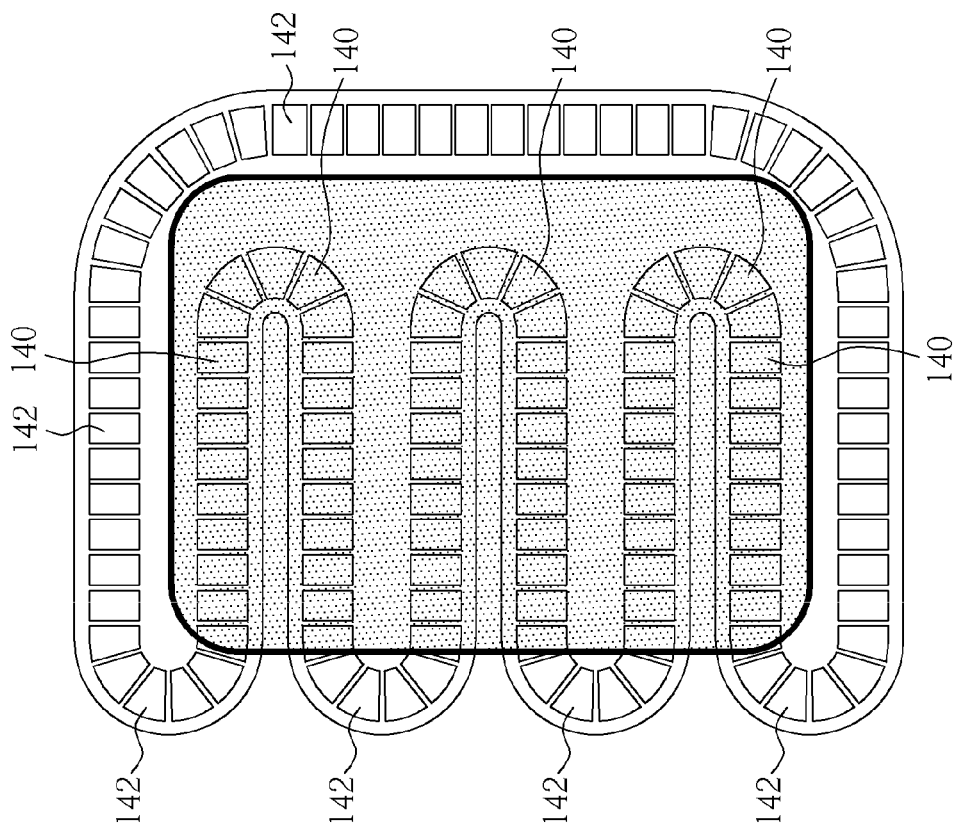

Please refer to FIG. 6. It is noteworthy that only the p-doped regions 122 and the gaps 124 of the non-continuous doped region 120 are shown in FIG. 6 while the n-doped regions 126 are omitted from FIG. 6 in order to clarify the spatial relationship of the p-doped regions 122 and the gaps 124 of the non-continuous doped region 120 in the layout pattern while other elements are omitted. However, those skilled in the art would easily realize the relationships of those omitted elements according to the aforementioned descriptions and FIGS. 2-5. As shown in FIG. 6, the non-continuous doped region 120 includes an inner portion 140 and an outer portion 142 defined therein according to the preferred embodiment. In detail, the non-continuous doped region 120 extends along the brim of the deep well 106 and has a racetrack or a comb shape. Thus the p-doped regions 122 and the gaps 124 are arranged to have a racetrack or a comb shape, accordingly. As shown in FIG. 6, a base, two outmost teeth of the comb, and proximal ends of each teeth of the comb are defined as the outer portion 142 while the inner teeth, and bases of each tooth are defined as the inner portion 140. It is noteworthy that the gaps 124 positioned in the inner portion 140 include a first pattern density $D_1$, the gaps 124 positioned in the outer portion 142 include a second pattern density $D_2$, and the first pattern density $D_1$ is smaller than the second pattern density $D_2$. For example, a ratio $R_1$ of the total area of the gaps 124 positioned in the inner portion 140 and the total area of the non-continuous doped region 120 is smaller than or equal to 15%, while a ratio $R_2$ of the total area of the gaps 124 positioned in the outer portion 142 and the total area of the non-continuous doped region 120 is smaller than or equal to 25%. Furthermore, the difference between the ratio $R_1$ and the ratio $R_2$ is, for example but not limited to, 7%. Additionally, the n-doped region 126 can be selectively omitted from the gaps 124 as mentioned above. In detail, each of the gaps 124 positioned in the outer portion 142 includes one n-doped region 126 while some of the gaps 124 positioned in the inner portion 140 include no n-doped region 126 formed therein. Because the dope concentration in the n-type deep well 106 corresponding to the outer portion 142 (that is the brim of the deep well 106) is inherently lower than the dopant concentration in the n-type deep well 106 corresponding to inner portion 140 due to the nature of ion implantation process, the HV MOS transistor device 100 suffers higher $R_{ON}$ corresponding to the outer portion 142. Therefore the gaps 124 arranged in the outer portion 142 are provided to have the higher second pattern density $D_2$ or have more n-doped regions 126 according to the preferred embodiment. Since the total area of the gaps 124 arranged in the outer portion 142 is greater and amounts of the n-doped regions 124 in the outer portion 142 is larger, $R_{ON}$ of the HV MOS transistor device 100 corresponding to the outer portion 142 is reduced without lowering the breakdown voltage.

Figure 7:
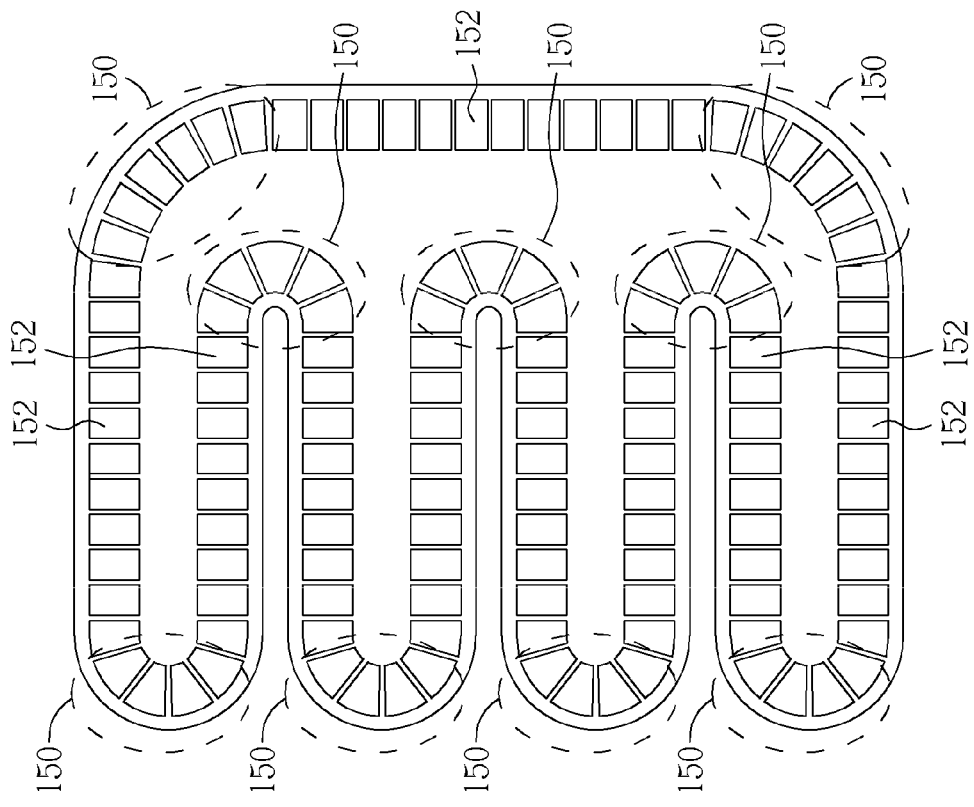

Please refer to FIG. 7. As mentioned above, only the p-doped regions 122 and the gaps 124 are shown in FIG. 7 while the n-doped regions 126 are omitted from FIG. 7 in order to clarify the spatial relationship of the p-doped regions 122 and the gaps 124 of the non-continuous doped region 120 in the layout pattern while other elements are omitted. However, those skilled in the art would easily realize the relationships of those omitted elements according to the aforementioned descriptions and FIGS. 2-5. As shown in FIG. 7, the non-continuous doped region 120 includes a plurality of corner areas 150 and a plurality of straight-line areas 152 according to the preferred embodiment. As mentioned above, the non-continuous doped region 120 extends along the brim of the deep well 106 and has a comb shape. Accordingly, portions of the non-continuous doped region 120 having an arc profile are defined as the corner area 150 while portions of the non-continuous doped region 120 having the straight-line profile are defined as the straight-line areas 152. It is noteworthy that the gaps 122 positioned in the corner areas 150 include a third pattern density $D_3$, the gaps 122 positioned in the straight-line areas 152 includes a fourth pattern density $D_4$, and the third pattern density $D_3$ is larger than the fourth pattern density $D_4$. Additionally, the n-doped region 126 can be selectively omitted from the gaps 124 as mentioned above. In detail, each of the gaps 124 positioned in the corner areas 152 includes one n-doped region 126 while some of the gaps 124 positioned in the straight-line areas 152 include no n-doped region 126 formed therein. Because the electrical field corresponding to the corner areas 150 is always larger than the electrical field corresponding to the straight-line portions 152, the HV MOS transistor device 100 suffers higher $R_{ON}$ corresponding to the corner areas 150. Therefore the gaps 124 arranged in the corner areas 150 are provided to have the higher third pattern density $D_3$ or have more n-doped regions 126 according to the preferred embodiment. Since the total area of the gaps 124 arranged in the corner areas 150 is greater and amounts of the n-doped regions 124 in the corner areas 150 is larger, $R_{ON}$ of the HV MOS transistor device 100 corresponding to the outer portion 142 is reduced without lowering the breakdown voltage.

According to the HV MOS transistor device and its layout pattern provided by the present invention, the non-continuous doped region is rendered to improve the breakdown voltage of the HV MOS transistor device. Furthermore, since the non-continuous doped region is interrupted by the gaps, the total area of doped portions of the non-continuous doped region is reduced. More important, the doped regions which have conductivity type the same with the sour/drain formed in the gaps serve as an easy pathway for the passing electrons. Consequently, $R_{ON}$ is decreased efficaciously. Briefly speaking, the HV MOS transistor device and the layout pattern thereof provided by the present invention realize the expectation of high breakdown voltage and low $R_{ON}$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a high voltage metal-oxide-semiconductor (HV MOS) transistor device comprising:
   a first doped region having a second conductivity type;
   a second doped region having the second conductivity type; and
   an non-continuous doped region, formed in between the first doped region and the second doped region, the non-continuous doped region further comprising:
   a plurality of fourth doped regions having a first conductivity type being complementary to the second conductivity type;
   a plurality of gaps, the gaps and the fourth doped regions being alternately arranged; and
   a plurality of fifth doped regions formed in the gaps, the fifth doped regions comprising the second conductivity type, and the fifth doped regions being entirely spaced apart from the fourth regions by the gaps.

2. The layout pattern of the HV MOS transistor device according to claim 1, wherein the first doped region, the second doped region, and the non-continuous doped region are spaced apart from each other.

3. The layout pattern of the HV MOS transistor device according to claim 1, wherein a ratio between a total area of the gaps and a total area of the non-continuous doped region is smaller than or equal to 20%.

4. The layout pattern of the HV MOS transistor device according to claim 1, wherein a length of the fifth doped regions is equal to a width of the fourth doped regions.

5. The layout pattern of the HV MOS transistor device according to claim 1, wherein a width of the gaps is equal to or smaller than 9 micrometer (μm).

6. The layout pattern of the HV MOS transistor device according to claim 5, wherein a width of the fifth doped regions is smaller than 7 μm.

7. The layout pattern of the HV MOS transistor device according to claim 1, wherein the non-continuous doped region comprises an inner portion and an outer portion defined therein.

8. The layout pattern of the HV MOS transistor device according to claim 7, wherein a pattern density of the gaps arranged in the inner portion is smaller than a pattern density of the gaps arranged in the outer portion.

9. The layout pattern of the HV MOS transistor device according to claim 8, wherein a ratio between a total area of the gaps positioned in the inner portion and a total area of the non-continuous doped region is smaller than or equal to 15%, and a ratio between a total area of the gaps positioned in the outer portion and the non-continuous doped region is smaller than or equal to 25%.

10. The layout pattern of the HV MOS transistor device according to claim 1, wherein the non-continuous doped region comprises a plurality of corner areas and a plurality of straight-line areas, and a pattern density of the gaps arranged in the corner areas is larger than a pattern density of the gaps arranged in the straight-line areas.

11. The layout pattern of the HV MOS transistor device according to claim 1, wherein each of the gaps comprising one fifth doped region formed therein.

12. A high voltage metal-oxide-semiconductor (HV MOS) transistor device comprising:
   a substrate having an insulating layer formed thereon;
   a gate positioned on the substrate and covering a portion of the insulating layer;
   a drain region positioned in the substrate, the drain region comprising a second conductivity type;
   a source region positioned in the substrate, the source region comprising the second conductivity type; and
   a non-continuous doped region positioned in between the drain region and the source region, the non-continuous doped region further comprising:
      a plurality of fourth doped regions having a first conductivity type complementary to the second conductivity type;
      a plurality of gaps, the gaps and the fourth doped regions being alternately arranged; and
      a plurality of fifth doped regions formed in the gaps and having the second conductivity type, the fifth doped regions being entirely spaced apart from the fourth regions by the gaps.

13. The HV MOS transistor device according to claim 12, further comprising a deep well having the second conductivity type.

14. The HV MOS transistor device according to claim 13, wherein the source region, the drain region, and the non-continuous doped region are all formed in the deep well.

15. The HV MOS transistor device according to claim 12, wherein the non-continuous doped region is formed under and covered by the insulating layer.

16. The HV MOS transistor device according to claim 12, wherein a length of the fifth doped regions is equal to a width of the fourth doped regions.

17. The HV MOS transistor device according to claim 12, wherein a width of the gaps is smaller than 9 μm.

18. The HV MOS transistor device according to claim 17, wherein a width of the fifth doped regions is smaller than 7 μm.

* * * * *